(12) United States Patent
Constantinescu et al.

(10) Patent No.: US 10,804,930 B2
(45) Date of Patent: Oct. 13, 2020

(54) COMPRESSED DATA LAYOUT WITH VARIABLE GROUP SIZE

(71) Applicant: International Business Machines Corporation, Armonk, NY (US)

(72) Inventors: M. Corneliu Constantinescu, San Jose, CA (US); Leo Shyh-Wei Luan, Saratoga, CA (US); Wayne A. Sawdon, San Jose, CA (US); Frank B. Schmuck, Campbell, CA (US)

(73) Assignee: International Business Machines Corporation, Armonk, NY (US)

( * ) Notice: Subject to any disclaimer, the term of this patent is extended or adjusted under 35 U.S.C. 154(b) by 558 days.

(21) Appl. No.: 14/970,636

(22) Filed: Dec. 16, 2015

(65) Prior Publication Data
US 2017/0177602 A1 Jun. 22, 2017

(51) Int. Cl.
H03M 7/30 (2006.01)
(52) U.S. Cl.
CPC .................. *H03M 7/3077* (2013.01)
(58) Field of Classification Search
CPC .................................................. H03M 7/3077
USPC ....................................................... 707/693
See application file for complete search history.

(56) References Cited

U.S. PATENT DOCUMENTS

| 5,200,864 | A | 4/1993 | Dunn et al. |
| 5,237,675 | A | 8/1993 | Hannon, Jr. |
| 5,627,995 | A | 5/1997 | Miller et al. |
| 5,959,560 | A * | 9/1999 | Said ........................ H03M 7/40 341/107 |
| 7,430,638 | B2 | 9/2008 | Kellar |
| 8,935,222 | B2 * | 1/2015 | Hirsch .................. G06F 3/0641 707/692 |
| 9,367,557 | B1 * | 6/2016 | Lin ...................... G06F 16/1744 |
| 2002/0073298 | A1 * | 6/2002 | Geiger .................. G06F 12/023 711/206 |
| 2006/0190939 | A1 * | 8/2006 | Chen ........................ G06F 8/65 717/168 |

(Continued)

OTHER PUBLICATIONS

Waters, "Analysis of Self Indexing, Disc Files," The Computer Journal, vol. 18 No. 3 (1975), pp. 200-205.
(Continued)

*Primary Examiner* — Hosain T Alam
*Assistant Examiner* — Saba Ahmed
(74) *Attorney, Agent, or Firm* — Lieberman & Brandsdorfer, LLC

(57) ABSTRACT

The embodiments described herein relate to managing compressed data to optimize file compression. A compression is performed on a first set of data to create a first set of compressed data partitions in a compression group. A partition table is constructed, and partition entries for the first data block are added to the table in conjunction with the first set. A current size of the compression group is assessed. In response to a compression ratio being greater than a target compression ratio and internal fragmentation of the compression group being smaller than a threshold, the compression group is dynamically completed. The dynamic completion decides a size for the compression group. The partition table is added to the compression group by assigning space within the first compression group for the table. The compression group is written to persistent storage.

20 Claims, 6 Drawing Sheets

(56) References Cited

U.S. PATENT DOCUMENTS

| | | | |
|---|---|---|---|
| 2011/0087840 A1* | 4/2011 | Glasco | G06F 12/08 |
| | | | 711/118 |
| 2011/0099155 A1* | 4/2011 | Shau | G06F 16/284 |
| | | | 707/693 |
| 2015/0074066 A1* | 3/2015 | Li | G06F 16/221 |
| | | | 707/693 |

OTHER PUBLICATIONS

Lin, "Variable-Sized Object Packing and Its Applications to Instruction Cache Design," Computers and Electrical Engineering, 34 (2008), pp. 438-444.

Li et al., "Performance of Key Features and Interfaces in DryadILINQ CTP," SALSA Group, Pervasive Technology Institute, Indiana University, (Dec. 13, 2011).

* cited by examiner

COMPRESSED DATA LAYOUT WITH VARIABLE GROUP SIZE

BACKGROUND

The embodiments described herein relate to data compression. More specifically, the embodiments relate to arranging compressed data to optimize file compression.

File systems organize data into files, with each file representative of a number of blocks of constant size, and each block representative of a continuous set of bytes. In compression enabled file systems, the number of blocks required to store the data is reduced. Address space of raw data is typically divided into segments, with each segment being a set of contiguous blocks within a logical block device or a file. These segments are compressed into compression groups. With a fixed size compression group size, some compression groups may have all of their blocks full with the compressed data utilizing the entirety of the allotted storage space, while other compression groups may have blocks that are only partially filled with compressed data, resulting in internal fragmentation. Accordingly, in a fixed size compression group the maximum attainable compression ratio is limited by the compression group size.

SUMMARY

This invention comprises a method, computer program product, and system for managing compressed data to optimize file compression.

According to one aspect, a method is provided for managing compressed data. A compression is performed on a first block of data to create a first set of compressed data partitions in a compression group. A partition table is constructed, and partition entries for the first data block are added to the table in conjunction with the first set. A current size of the compression group is assessed. In response to a compression ratio being greater than a target compression ratio and internal fragmentation of the compression group being smaller than a threshold, the compression group is dynamically completed. The dynamic completion decides a size for the compression group. The partition table is added to the compression group by assigning space within the first compression group for the table. The compression group is written to persistent storage.

According to another aspect, a computer program product is provided to manage compressed data. The computer program product includes a computer readable storage device having computer readable code embodied therewith. The program code is executable by a processor to perform a compression on a first set of data to create a first set of compressed data partitions in a compression group. A partition table is constructed, and partition entries for the first data block are added to the table in conjunction with the first set. A current size of the compression group is assessed. In response to a compression ratio being greater than a target compression ratio and internal fragmentation of the compression group being smaller than a threshold, the compression group is dynamically completed. The dynamic completion decides a size for the compression group. The partition table is added to the compression group by assigning space within the first compression group for the table. The compression group is written to persistent storage.

According to yet another aspect, a system is provided to manage compressed data. A processing unit is in communication with memory. A functional unit is in communication with the processing unit. The functional unit performs a compression on a first block of data to create a first set of compressed data partitions in a compression group. The functional unit constructs a partition table, and adds partition entries for the first data block to the table in conjunction with the first set. The function unit assesses a current size of the compression group. In response to a compression ratio being greater than a target compression ratio and internal fragmentation of the compression group being smaller than a threshold, the function unit dynamically completes the compression group. The dynamic completion decides a size for the compression group. The functional unit adds the partition table to the compression group by assigning space within the first compression group for the table. The functional unit writes the compression group to persistent storage.

Other features and advantages of this invention will become apparent from the following detailed description of the presently preferred embodiment of the invention, taken in conjunction with the accompanying drawings.

BRIEF DESCRIPTION OF THE SEVERAL VIEWS OF THE DRAWINGS

The drawings referenced herein form a part of the specification. Features shown in the drawings are meant as illustrative of only some embodiments of the invention, and not of all embodiments of the invention unless otherwise explicitly indicated. Implications to the contrary are otherwise not to be made.

DETAILED DESCRIPTION

Figure 1:
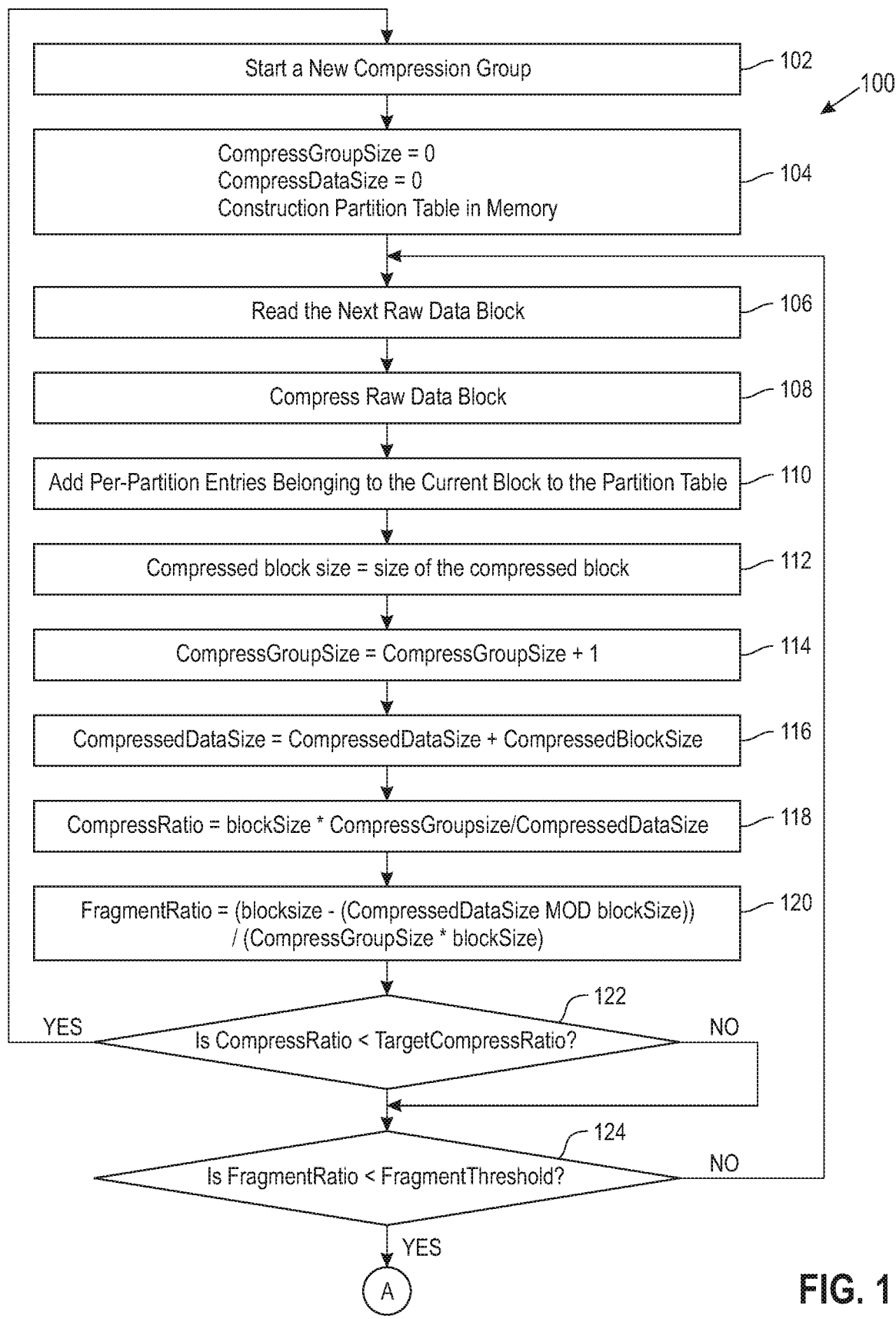
FIG. 1 depicts a flow chart illustrating a method for compression of a file.
Figure 1:
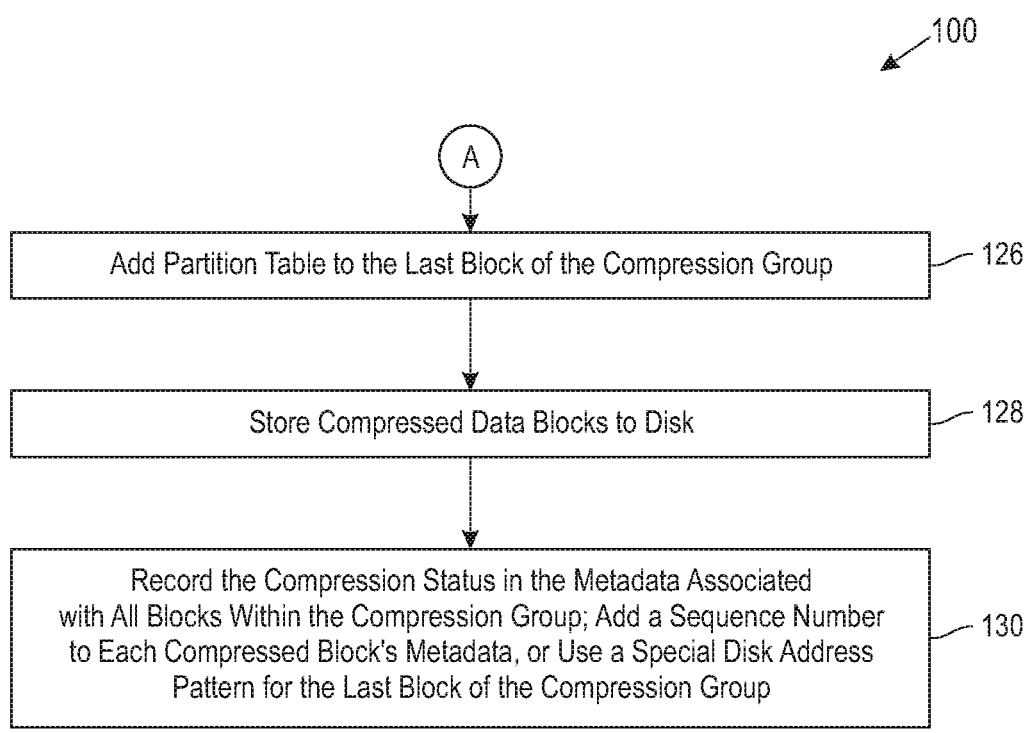

It will be readily understood that the components of the present invention, as generally described and illustrated in the Figures herein, may be arranged and designed in a wide variety of different configurations. Thus, the following detailed description of the embodiments of the apparatus, system, and method of the present invention, as presented in the Figures, is not intended to limit the scope of the invention, as claimed, but is merely representative of selected embodiments of the invention.

The functional units described in this specification have been labeled as managers. A manager may be implemented in programmable hardware devices such as field programmable gate arrays, programmable array logic, programmable logic devices, or the like. The managers may also be implemented in software for processing by various types of processors. An identified manager of executable code may, for instance, comprise one or more physical or logical blocks of computer instructions which may, for instance, be organized as an object, procedure, function, or other construct. Nevertheless, the executables of an identified manager need not be physically located together, but may comprise disparate instructions stored in different locations which, when joined logically together, comprise the managers and achieve the stated purpose of the managers.

Indeed, a manager of executable code could be a single instruction, or many instructions, and may even be distributed over several different code segments, among different applications, and across several memory devices. Similarly, operational data may be identified and illustrated herein within the manager, and may be embodied in any suitable form and organized within any suitable type of data structure. The operational data may be collected as a single data set, or may be distributed over different locations including over different storage devices, and may exist, at least partially, as electronic signals on a system or network.

Reference throughout this specification to "a select embodiment," "one embodiment," or "an embodiment" means that a particular feature, structure, or characteristic described in connection with the embodiment is included in at least one embodiment of the present invention. Thus, appearances of the phrases "a select embodiment," "in one embodiment," or "in an embodiment" in various places throughout this specification are not necessarily referring to the same embodiment.

Furthermore, the described features, structures, or characteristics may be combined in any suitable manner in one or more embodiments. In the following description, numerous specific details are provided, such as examples of a topology manager, a hook manager, a storage topology manager, a resource utilization manager, an application manager, a director, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

The illustrated embodiments of the invention will be best understood by reference to the drawings, wherein like parts are designated by like numerals throughout. The following description is intended only by way of example, and simply illustrates certain selected embodiments of devices, systems, and processes that are consistent with the invention as claimed herein.

In the following description of the embodiments, reference is made to the accompanying drawings that form a part hereof, and which shows by way of illustration the specific embodiment in which the invention may be practiced. It is to be understood that other embodiments may be utilized because structural changes may be made without departing from the scope of the present invention.

It is understood that a data block is a contiguous set of bits or bytes that form an identifiable unit of data. A partition is referred to herein as a continuous set of bytes within the data block, with the partition being a subset of the data block. Compression of raw data, e.g. uncompressed data, is performed on a partition basis. A compressed group is referred to herein as a set of adjacent blocks containing compressed data.

As shown and described in the figures below, wasted space incurred when a file is partitioned into compression groups is reduced. The size of the compression group is not static. Rather, determination of the size of the compression group is dynamic with the size determined during data compression. This is referred to as a variable compression group size. By varying the size of the compression group, internal fragmentation is mitigated without sacrificing performance of concurrent data reads and data updates.

Data may have different characteristics leading to different aspects of compressibility. Referring to FIG. 1, a flow chart (100) is provided illustrating a process for compressing data. A new compression group is started (102). Initially, the compression group size and the compressed data size are initialized, and a partition table is constructed and stored in memory (104). The partition table is constructed in memory and is not assigned any disk space until the size of the compression group is decided. For a large compression group, more space is needed for the partition table. For example, if a partition size is 32 KB and it uses an 8 byte descriptor, including one additional 1 MB raw data block adds 256 bytes to the partition table size.

Given a logical block number within a file or a logical block device, a number of blocks, typically starting from block 0, are compressed. In one embodiment, the compression is for all of the blocks within the file or device. Following the initializations at step (104), the next raw data block, e.g. uncompressed data block, is read (106), and compressed (108). Each data block may have one or more partitions. On a partition basis, indexes for the partitions belonging to the current data block are added to the partition table (110). Following step (110), several compression tracking variables are modified, as follows: the compressed block size variable is set to the size of the compressed data block (112), the compression group size variable is incremented (114), the compressed data size variable is set to the value of the compressed data size added to the compressed block size (116), the compress rate compression ratio is set to the product of the block size and the quotient of the compressed group size and the compressed data size (118), and the fragment ratio is calculated (120) as follows:

$$\text{FragmentRatio} = (\text{blocksize} - (\text{compressedDataSize MOD block size}))/(\text{compressGroupSize} * \text{blocksize})$$

In one embodiment, the compression group size is configured with a pre-defined limit. For example, the compression group size may be set to a limit of 50 blocks, although this quantity is for exemplary purposes and should not be considered limiting. In one embodiment, the compression group size limitation is configured to maintain concurrency control for multi-threaded access control. Accordingly, as each raw data block is compressed and the partition table is updated to reflect the compression, several variables are modified to accurately reflect the compression.

Following the modification of the compression variables at steps (112)-(120), it is determined if the compression ratio, as assessed at step (118), is less than a target compression ratio (122). An affirmative response to the assessment at step (122) is an indication that the data within the current set of blocks is not sufficiently compressible to warrant compression, as shown herein by a return to step (102). However, a non-affirmative response to the determination at step (122) is followed by another assessment to determine if the fragment ratio, as assessed at step (120), is less than a fragment threshold value (124). In one embodiment, the fragment threshold value is a pre-determined value, such as 5-10% of the blocks. A non-affirmative response to the assessment at step (124) is followed by a return to step (106) to continue with compression of raw data into the compression group. However, an affirmative response to the assessment at step (124) is followed by completing the compression group. Namely, the compression status of all blocks within the compression group is stored, the partition table for the compression group is added to the last block of the compression group (126), followed by storing the compressed data block(s) to persistent storage (128). In one embodiment, the partition table is stored in a footer of the compression group. Finally, the compression state is recorded in the metadata associated with all blocks within the compression group, and either a sequence number is added to each compressed block's metadata, or a special disk address pattern is used for the last block of the compression group (130). The data added at step (130) is employed to later facilitate finding the first block of the compression group. Accordingly, as shown herein, after compression is completed, the partition table created during the compression process is stored with the compression group in persistent storage.

Figure 2:
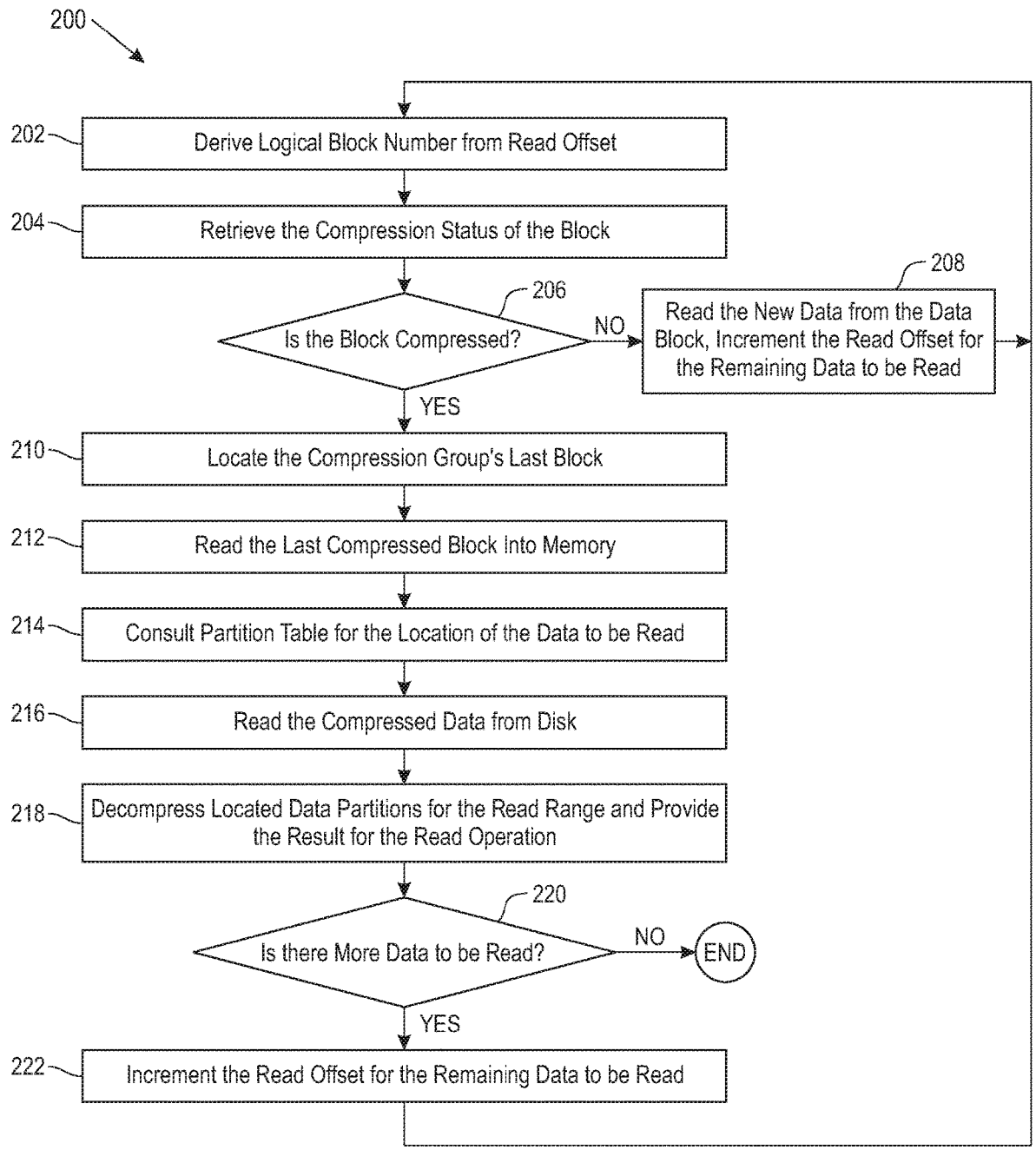
FIG. 2 depicts a flow chart illustrating a method for randomly reading a data partition from a compression group.

As shown and described in FIG. 1, the size of the compression group can vary from one group to the next. The partition table is created during the compression process, and is assigned disk space once the size of the compression group has been decided. Each compression group can be independently de-compressed. An example of the de-compression is shown and described in FIG. 2, illustrating a flow chart (200) for reading data from a compression group. As shown a logical block number is derived from a read offset value (202), so that the logical block number may be mapped to the physical block address. The compression status of the logical block is retrieved (204), and from the status it is determined if the logical block is compressed (206). A non-affirmative response is followed by reading the raw data from the data block, and incrementing the read offset for the remaining data to be read (208), followed by a return to step (202). However, an affirmative response to the determination at step (206) is an indication that the block is in a compressed format. The last block of the compression group is located (210), for example, by inferring from the sequence number of the block within the compression group or by searching for the special physical disk address pattern of the last block within the compression group. The last block of the compression group is then read into memory (212). Following step (212), the partition table of the compression group is consulted to ascertain the location of the data to be read (214). As shown and described in FIG. 1, the partition table is stored in the footer of the compression group. Based upon the data in the partition group, the data associated with the read request is located and read from disk in compressed format (216). Thereafter, the data partition(s) for the read request is de-compressed (218). More specifically, at step (218), the range of the data associated with the read request is de-compressed, thereby providing a result to the read operation. Accordingly, as shown herein, the partition table for the located partition group is used to locate the data specific to the read request, and thereby limit the data subject to de-compression to support the read request.

Following the de-compression at step (218), it is determined if there is more data to be read to support the read request (220). For example, in one embodiment, the compressed data may span more than one compression group. A non-affirmative response to the determination at step (220) is followed by a conclusion of the read request, since the read request is now completed. However, an affirmative response to the determination at step (220) is followed by an increment of the read offset for the remaining data to be read (222), and a return to step (202). Accordingly, as shown herein, the read process locates the compression group and employs the partition table in the compression group to limit data decompression to data subject to the read request.

Figure 3:
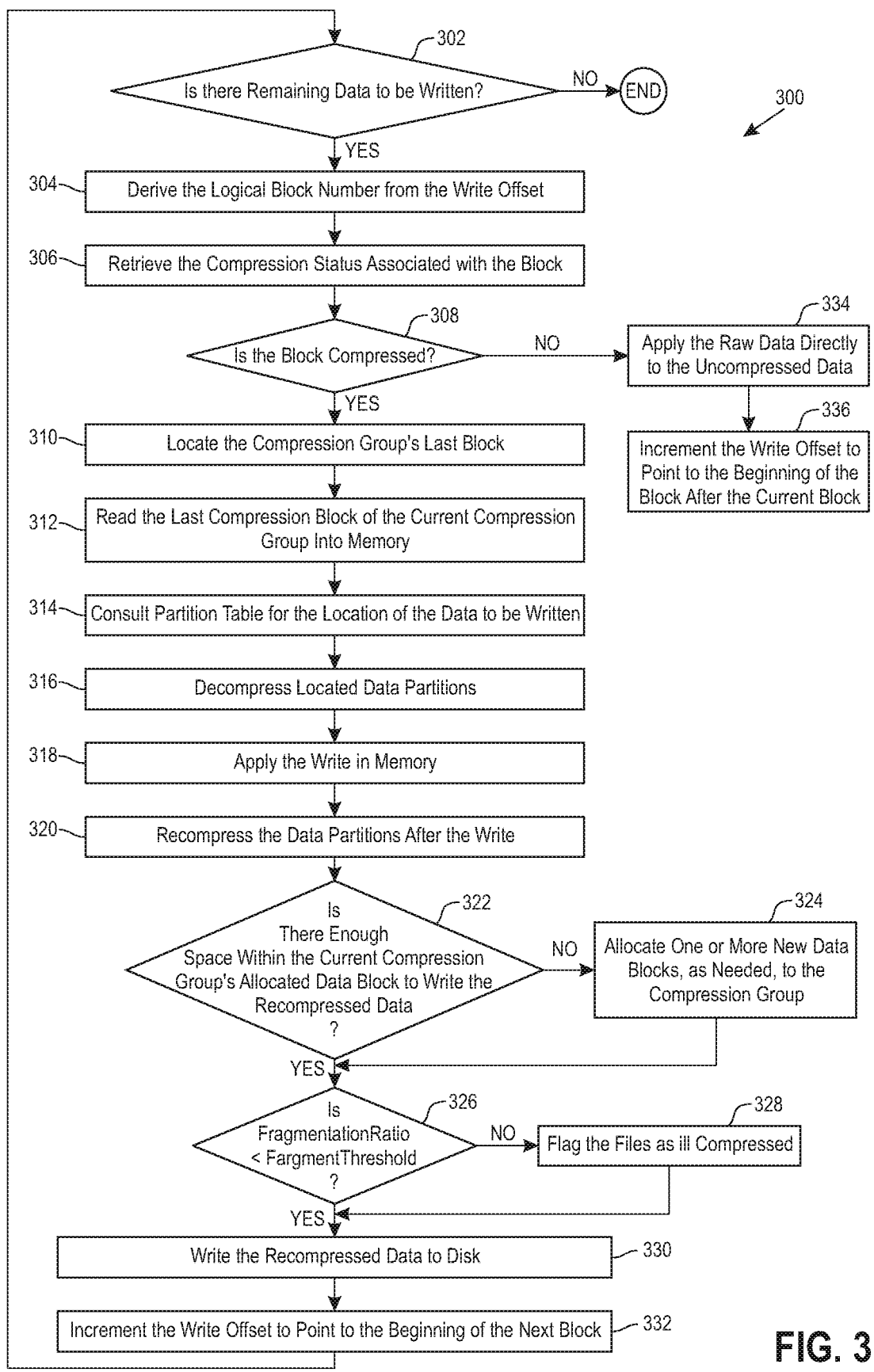
FIG. 3 depicts a flow chart illustrating a method for randomly writing data into a compression group.

In addition to compressing data into a compression group of variable size and reading data from a compression group, the compression group may be subject to an update. Referring to FIG. 3, a flow chart (300) is provided illustrating a process for updating a compression group. As shown, it is determined if there is remaining data to be written and stored (302). A non-affirmative response to the determination at step (302) concludes the update process. However, an affirmative response is following by deriving the logical block number of the write offset for the associated data (304), and retrieving the compression status associated with the block (306). The logical block may be in a compressed format or non-compressed format.

Following the status retrieval at step (306), it is determined if the retrieved logical block is compressed (308). A non-affirmative response to the determination at step (308) is followed by applying the raw data associated with the read request directly to the uncompressed data (334), and incrementing the write offset to point to the beginning of the block after the current block (336).

However, an affirmative response to the determination at step (308) is followed by locating the last block of the compression group (310), and reading the located last block into memory (312). As shown and described in FIG. 1, the last block of the compression group contains the partition table. Following step (312), the partition table for the compression group is consulted to ascertain the location of the data to be written within the compression group (314). The data partition subject to the write data is located (316), the write data is applied to memory (318), and the data partition is re-compressed (320).

Before the re-compression of the group is completed, it is determined if there is enough space within the current compression group's allocated data blocks to write the re-compressed data (322). A non-affirmative response to the determination at step (322) is followed by allocating one or more new data blocks, as needed, to the compression group (324). However, an affirmative response to the determination at step (322) or following step (324) is followed by determining if the fragmentation ratio for the compression group is less than the associated fragment threshold (326). See step (124) in the data compression process for further details of the fragmentation assessment. A non-affirmative response to the determination at step (326) is followed by flagging the file as ill compressed (328). The handling of a file flagged as ill compressed is beyond the scope of the present disclosure. Accordingly, a further discussion of the ill compressed file will not be provided herein.

However, an affirmative response at step (326) or the flagging of the file at step (328) is followed by writing the compressed data to persistent storage (330), and incrementing the write offset to point to the beginning of the next block (332). The process then proceeds to step (302) to continue with application of any remaining data to be written and compressed into a compression group.

As shown in FIG. 3, when an update overlaps with a compressed group, the header block of the compression group is located in the same way as in the read operation shown and described in FIG. 2. If the update causes a degraded compression ratio change and there is insufficient unused space within currently used blocks in the compression group, then the needed disk block is added to accommodate the additional disk space for the update and the partition table of the compression group is moved to the newly allocated data block. The sequence numbers of the data blocks belonging to the compression group is updated accordingly or the special disk address pattern is used for the new last block of the compression group Adjacent compression groups can be analyzed in order to determine an optimal grouping of contiguous blocks, also referred to herein as re-grouping. The method for regrouping is beyond the scope of the present disclosure.

As shown in FIGS. 1-3, methods are provided to demonstrate processes for data compression, de-compression, support of a read or update transaction request, and compression re-grouping. With reference to FIG. 4, a block diagram (400) is provided illustrating a data storage system for performing the processes described above in FIGS. 2-4. The data storage system may run on one or more servers (410) that include a processing unit (412) in communication with memory (414) across a bus (416).

A set of tools are provided in communication with the processing unit (412) to support data compression, including management of both data compression associated with data storage, and reading and writing the compressed data. In one embodiment, the tools include: a compression manager (422), a storage manager (424), and a transaction manager (426). The compression manager (422) is provided to perform compression on raw data, the storage manager (424) is provided to store compressed data in one or more blocks of a compression group, and the transaction manager (426) is provided to satisfy a read or update request requiring one or more compressed data storage blocks.

The compression manager (422) performs a compression on a first data block to create a first set of compressed data partitions, and the storage manager (424) stores the first set in one or more blocks of a compression group. The compression manager (422) and/or the storage manager (424) constructs a partition table, and adds partition entries for the first data block to the table in conjunction with the first set. The storage manager (424) assesses a current size of the compression group. In response to a compression ratio being greater than a target compression ratio and internal fragmentation of the compression group being smaller than a threshold, the storage manager (424) dynamically completes the compression group. In one embodiment, the dynamic completion includes the storage manager (424) to decide a size for the compression group. In one embodiment, in response to the fragmentation exceeding the threshold, the compression manager (422) iteratively performs a compression on a second block, i.e. next data block, to create a second set of data partitions, i.e. next set of data partitions, in the compression group, and the storage manager (424) adds partition entries for the second data block to the table. The storage manager (424) adds the partition table to the compression group, which includes assigning space within the compression group for the table. The storage manager (424) writes the compression group to persistent storage. As shown herein, an example compression group (460) is shown written to persistent storage (450), with the compression group including an associated partition table (462).

As discussed above, the transaction manager (426) is provided to satisfy read and write transaction requests associated with the compression group, as described above with reference to FIGS. 1-3.

For example, in response to a request to read data of a data partition from the compression group, the transaction manager (426) consults a disk address of the data to be read, identifies a last data block within the compression group, and consults the partition table of the last data block to ascertain a location of the data partition. In one embodiment, a per-compression-group sequence number is included in the metadata of each compressed data block, counting backward from the last data block of the compression group. Alternatively a special disk address pattern for the last data block of the compression group may be used. In response to a request to write new data to the compression group, the transaction manager (426) consults the partition table for a location of a partition within the compression group to receive the new data, decompresses the located partition, writes the new data to the decompressed partition, and re-compresses the partition with the new data. In one embodiment, transaction manager (426) re-groups the compression group after the re-compression. The re-grouping includes the transaction manager (426) to store the re-compressed partition with an adjacently positioned compression group to reduce internal fragmentation. Accordingly, in one embodiment, the transaction manager (426) updates the compression group in response to a write transaction.

Figure 4:
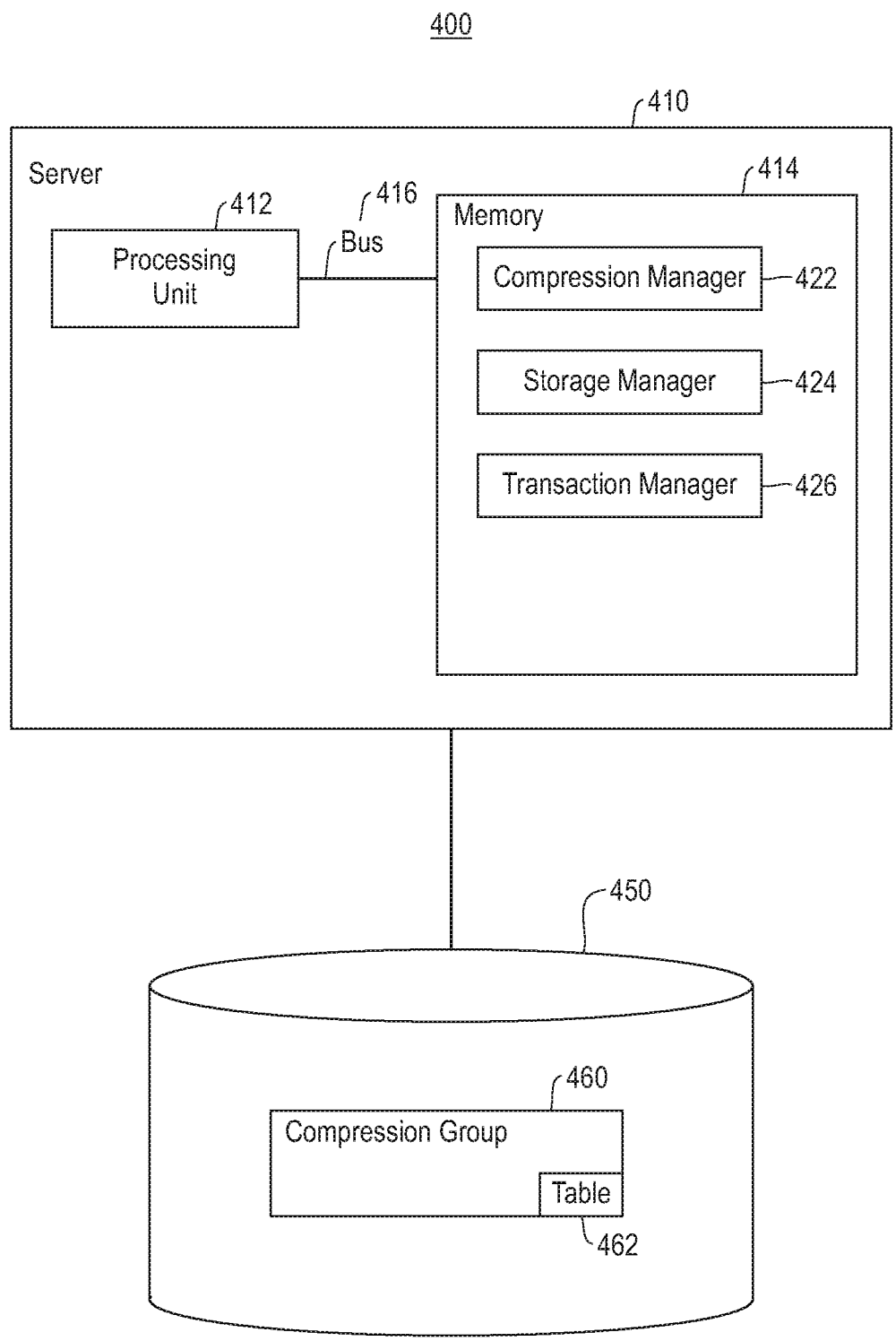
FIG. 4 depicts a block diagram illustrating tools embedded in a computer system for implementing the embodiments of FIGS. 1-3.

As identified above, the compression manager (422), storage manager (424), and transaction manager (426), hereinafter referred to as tools, function as elements to support data compression. The tools (422)-(426) are shown in the embodiment of FIG. 4 as residing in memory (414) local to the data storage system (410). However, in alternative embodiments, the tools (422)-(426) may reside as hardware tools external to the memory (420), or they may be implemented as a combination of hardware and software. Similarly, in one embodiment, the tools (422)-(426) may be combined into a single functional item that incorporates the functionality of the separate items. As shown herein, each of the tools (422)-(426) are shown local to the data storage server (410). However, in one embodiment they may be collectively or individually distributed across a network or multiple machines and function as a unit to support data compression. Accordingly, the tools may be implemented as software tools, hardware tools, or a combination of software and hardware tools.

Figure 5:
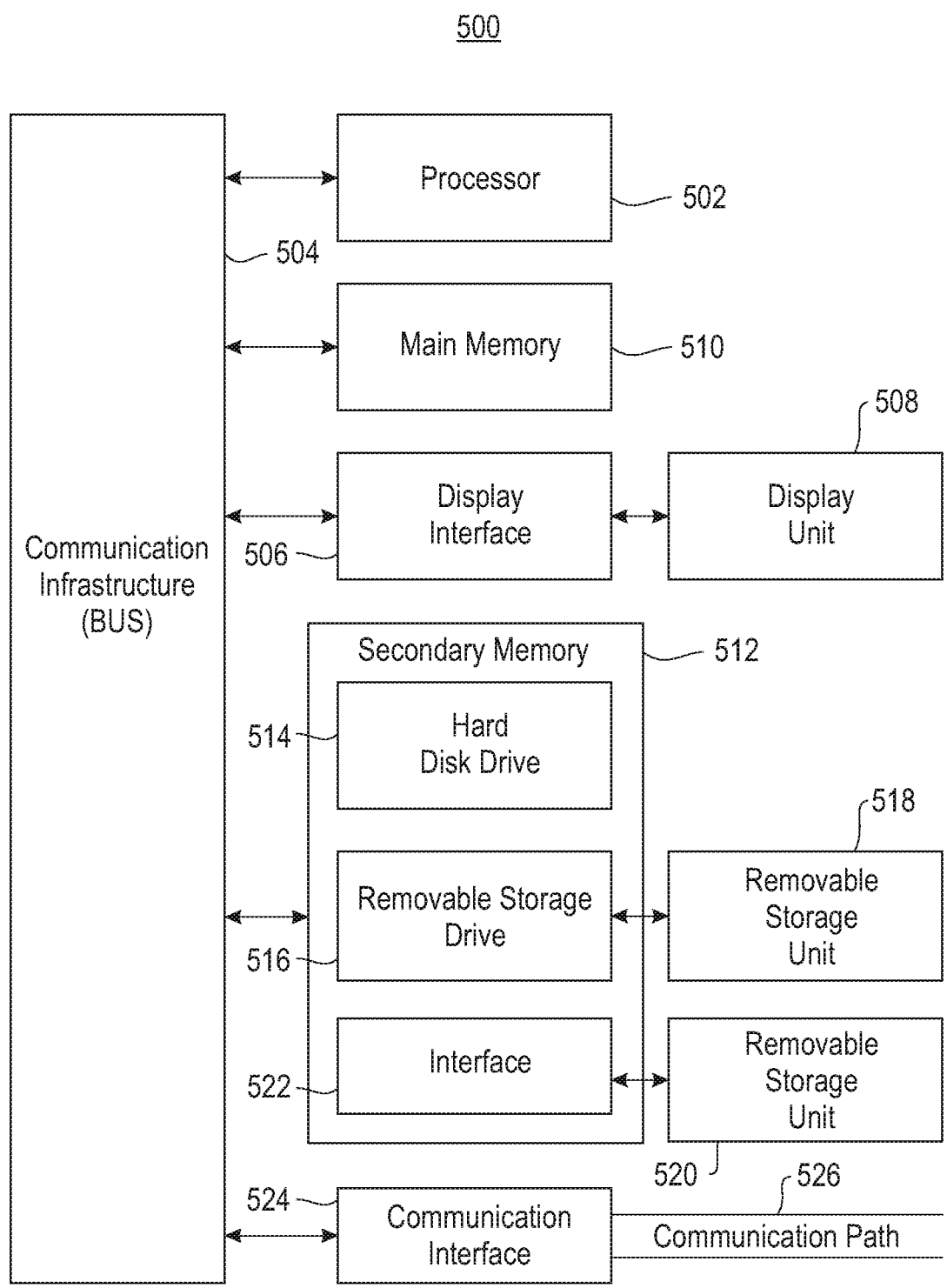
FIG. 5 depicts a block diagram showing a system for implementing the tools of FIG. 4.

With reference to FIG. 5, a block diagram (500) is provided illustrating an exemplary system for implementing the data compression and storage, as shown and described in the flow charts of FIGS. 1-3. The computer system includes one or more processors, such as a processor (502). The processor (502) is connected to a communication infrastructure (504) (e.g., a communications bus, cross-over bar, or network).

The computer system can include a display interface (506) that forwards graphics, text, and other data from the communication infrastructure (504) (or from a frame buffer not shown) for display on a display unit (508). The computer system also includes a main memory (510), preferably random access memory (RAM), and may also include a secondary memory (512). The secondary memory (512) may include, for example, a hard disk drive (514) and/or a removable storage drive (516), representing, for example, a floppy disk drive, a magnetic tape drive, or an optical disk drive. The removable storage drive (516) reads from and/or writes to a removable storage unit (518) in a manner well known to those having ordinary skill in the art. Removable storage unit (518) represents, for example, a floppy disk, a compact disc, a magnetic tape, or an optical disk, etc., which is read by and written to by removable storage drive (516). As will be appreciated, the removable storage unit (518) includes a computer readable medium having stored therein computer software and/or data.

In alternative embodiments, the secondary memory (512) may include other similar means for allowing computer programs or other instructions to be loaded into the computer system. Such means may include, for example, a removable storage unit (520) and an interface (522). Examples of such means may include a program package and package interface (such as that found in video game devices), a removable memory chip (such as an EPROM, or PROM) and associated socket, and other removable storage units (520) and interfaces (522) which allow software and data to be transferred from the removable storage unit (520) to the computer system.

The computer system may also include a communications interface (524). Communications interface (524) allows software and data to be transferred between the computer system and external devices. Examples of communications interface (524) may include a modem, a network interface (such as an Ethernet card), a communications port, or a PCMCIA slot and card, etc. Software and data transferred via communications interface (524) is in the form of signals which may be, for example, electronic, electromagnetic, optical, or other signals capable of being received by communications interface (524). These signals are provided to communications interface (524) via a communications path (i.e., channel) (526). This communications path (526) carries signals and may be implemented using wire or cable, fiber optics, a phone line, a cellular phone link, a radio frequency (RF) link, and/or other communication channels.

In this document, the terms "computer program medium," "computer usable medium," and "computer readable medium" are used to generally refer to media such as main memory (510) and secondary memory (512), removable storage drive (516), and a hard disk installed in hard disk drive (514).

Computer programs (also called computer control logic) are stored in main memory (510) and/or secondary memory (512). Computer programs may also be received via a communication interface (524). Such computer programs, when run, enable the computer system to perform the features of the present embodiments as discussed herein. In particular, the computer programs, when run, enable the processor (502) to perform the features of the computer system. Accordingly, such computer programs represent controllers of the computer system.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the Figures illustrate the architecture, functionality, and operation of possible implementations of systems, methods and computer program products according to various embodiments of the present invention. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

It will be appreciated that, although specific embodiments of the invention have been described herein for purposes of illustration, various modifications may be made without departing from the spirit and scope of the invention. Accordingly, the scope of protection of this invention is limited only by the following claims and their equivalents.

We claim:

1. A method comprising:
providing a plurality of data blocks each comprising uncompressed data, each of the data blocks comprising partitions representing a subset of the data block;
compressing the compressed data of a first data block of the plurality of data blocks on a partition basis to provide compressed partitions of a compression group;
adding a partition entry for the compressed data block to a partition table;
calculating a compression ratio of the compression group, the compression ratio equaling a product of a size of the compressed data block (blockSize) and a quotient of a summation of a total number of compressed data blocks having entries in the partition table (CompressGroupSize) divided by a summation of sizes of all compressed data blocks having entries in the partition table (CompressDataSize);
in response to the compression ratio being greater than a target compression ratio and a fragment ratio of the compression group being larger than a fragment threshold, iteratively performing the following on one or more additional data blocks of the plurality of data blocks:
 compressing the additional data block on a partition basis and including the additional compressed data block in the compression group to dynamically change the size of the compression group;
 adding an additional partition entry for the compressed additional data block to the partition table;
 recalculating the compression ratio of the compression group for the additional compressed data block; and
 determining whether the recalculated compression ratio is greater than the target compression ratio and the fragment ratio is smaller than the fragment threshold;
in response to the recalculated compression ratio being greater than the target compression ratio and the fragment ratio being smaller than the fragment threshold, dynamically completing the compression group;
adding the partition table to the compressed group; and
writing the compression group to persistent storage.

2. The method of claim 1, further comprising, in response to a request to read data of a partition from the compression group:
consulting a disk address of the data to be read;
identifying a last data block within the compression group; and
consulting the partition table located in the last data block of the compression group to ascertain a location of the partition.

3. The method of claim 1, further comprising including a per-compression-group sequence number in metadata of each of the compressed data blocks, counting backward from the last data block of the compression group.

4. A computer program product comprising a computer readable storage medium having computer readable program code embodied therewith, the program code being executable by a processor to:
provide a plurality of data blocks each comprising uncompressed data, each of the data blocks comprising partitions representing a subset of the data block;
compress the compressed data of a first data block of the plurality of data blocks on a partition basis to provide compressed partitions of a compression group;
add a partition entry for the compressed data block to a partition table;
calculate a compression ratio of the compression group, the compression ratio equaling a product of a size of the compressed data block (blockSize) and a quotient of a summation of a total number of compressed data blocks having entries in the partition table (CompressGroupSize) divided by a summation of sizes of all compressed data blocks having entries in the partition table (CompressDataSize);
in response to the compression ratio being greater than a target compression ratio and a fragment ratio of the compression group being larger than a fragment threshold, iteratively perform the following on one or more additional data blocks of the plurality of data blocks:
compress the additional data block on a partition basis and included the additional compressed data block in the compression group to dynamically change the size of the compression group;
add an additional partition entry for the compressed additional data block to the partition table;
recalculate the compression ratio of the compression group for the additional compressed data block; and
determine whether the recalculated compression ratio is greater than the target compression ratio and the fragment ratio is smaller than the fragment threshold;
in response to the recalculated compression ratio being greater than the target compression ratio and the fragment ratio being smaller than the fragment threshold, dynamically complete the compression group;
add the partition table to the compressed group; and
write the compression group to persistent storage.

5. The computer program product of claim 4, further comprising program code to, in response to a request to read data of a partition from the compression group:
consult a disk address of the data to be read;
identify a last data block within the compression group; and
consult the partition table located in the last data block of the compression group to ascertain a location of the partition.

6. The computer program product of claim 4, further comprising computer program code to include a per-compression-group sequence number in metadata of each of the compressed data blocks, counting backward from the last data block of the compression group.

7. A system comprising:
a processing unit in communication with memory; and
a functional unit in communication the processing unit, the functional unit having one or more tools to support data compression, the functional unit to:
receive a plurality of data blocks each comprising uncompressed data, each of the data blocks comprising partitions representing a subset of the data block;
compress the compressed data of a first data block of the plurality of data blocks on a partition basis to provide compressed partitions of a compression group;
add a partition entry for the compressed data block to a partition table;
calculate a compression ratio of the compression group, the compression ratio equaling a product of a size of the compressed data block (blockSize) and a quotient of a summation of a total number of compressed data blocks having entries in the partition table (CompressGroupSize) divided by a summation of sizes of all compressed data blocks having entries in the partition table (CompressDataSize);
in response to the compression ratio being greater than a target compression ratio and a fragment ratio of the compression group being larger than a fragment threshold, iteratively perform the following on one or more additional data blocks of the plurality of data blocks:
compress the additional data block on a partition basis and include the additional compressed data block in the compression group to dynamically change the size of the compression group;
add an additional partition entry for the compressed additional data block to the partition table;
recalculate the compression ratio of the compression group for the additional compressed data block; and
determine whether the recalculated compression ratio is greater than the target compression ratio and the fragment ratio is smaller than the fragment threshold;
in response to the recalculated compression ratio being greater than the target compression ratio and the fragment ratio being smaller than the fragment threshold, dynamically complete the compression group;
add the partition table to the compressed group; and
write the compression group to persistent storage.

8. The system of claim 7, further comprising the functional unit to, in response to a request to read data of a partition from the compression group:
consult a disk address of the data to be read;
identify a last data block within the compression group; and
consult the partition table located in the last data block of the compression group to ascertain a location of the partition.

9. The method of claim 1, further comprising storing the partition table to a last block of the compression group.

10. The method of claim 1, further comprising storing the partition table a footer of the compression group.

11. The method of claim 1, further comprising assigning the compression group disk space after completion of the compressing of the data blocks and one or more additional data blocks.

12. The method of claim 1, further comprising calculating the fragment ratio to be equal to a quotient of a difference between blockSize minus CompressedDataSize modulo blockSize divided by a product of CompressGroupSize and blockSize.

13. The computer program product of claim 4, further comprising program code to store the partition table to a last block of the compression group.

14. The computer program product of claim 4, further comprising program code to store the partition table a footer of the compression group.

15. The computer program product of claim 4, further comprising program code to assign the compression group disk space after completion of the compressing of the data blocks and one or more additional data blocks.

16. The computer program product of claim 4, further comprising program code to calculate the fragment ratio to be equal to a quotient of a difference between blockSize minus CompressedDataSize modulo blockSize divided by a product of CompressGroupSize and blockSize.

17. The system of claim 7, further comprising the functional unit to store the partition table to a last block of the compression group.

18. The system of claim 7, further comprising the functional unit to store the partition table a footer of the compression group.

19. The system of claim 7, further comprising the functional unit to assign the compression group disk space after completion of the compressing of the data blocks and one or more additional data blocks.

20. The system of claim 7, further comprising the functional unit to calculate the fragment ratio to be equal to a quotient of a difference between blockSize minus CompressedDataSize modulo blockSize divided by a product of CompressGroupSize and blockSize.

* * * * *